(12) United States Patent
Hoogenraad et al.

(10) Patent No.: US 6,642,716 B1
(45) Date of Patent: Nov. 4, 2003

(54) DIFFUSION TENSOR MAGNETIC RESONANCE IMAGING INCLUDING FIBER RENDERING USING HYPERSTREAMLINES

(75) Inventors: Frank G. D. Hoogenraad, Den Bosch (NL); Ronaldus F. J. Holthuizen, Son en Breugel (NL); Arianne M. C. van Muiswinkel, Best (NL)

(73) Assignee: Koninklijke Philips Electronics, N.V., Eindhoven (NL)

( * ) Notice: Subject to any disclaimer, the term of this patent is extended or adjusted under 35 U.S.C. 154(b) by 0 days.

(21) Appl. No.: 10/146,396

(22) Filed: May 15, 2002

(51) Int. Cl.$^7$ ................................................ G01V 3/00
(52) U.S. Cl. ...................................... 324/309; 324/309
(58) Field of Search ................................. 324/307, 309, 324/311, 315, 318; 600/410, 419, 343; 128/653.2, 653.1

(56) References Cited

U.S. PATENT DOCUMENTS

| | | | |
|---|---|---|---|
| 5,488,297 A | | 1/1996 | Nakada ....................... 324/309 |
| 5,539,310 A | | 7/1996 | Basser et al. ............... 324/307 |
| 5,560,360 A | * | 10/1996 | Filler et al. ............... 128/653.2 |
| 5,969,524 A | * | 10/1999 | Pierpaoli et al. ............ 324/307 |
| 6,526,305 B1 | * | 2/2003 | Mori ........................... 600/410 |

FOREIGN PATENT DOCUMENTS

WO  WO 01/91639 A1  12/2001

OTHER PUBLICATIONS

Mori, et al., "Imaging Cortical Association Tracts in the Human Brain Using Diffusion–Tensor–Based Axonal Tracking", Magnetic Resonance in Medicine 47:215–223 (2002).
Delmarcelle, et al., "Visualizing Second–Order Tensor Fields with Hyperstreamlines", IEEE Computer Graphics & Applications, V. 13 N. 4, pp. 25–33 (1993).
Courant, et al. "Methods of Mathematical Physics", Interscience Publishers New York, vol. 1, ©1937, pp. 458–459.

* cited by examiner

*Primary Examiner*—Diego Gutierrez
*Assistant Examiner*—Brij B. Shrivastav
(74) *Attorney, Agent, or Firm*—Fay, Sharpe, Fagan, Minnich & McKee, LLP

(57) ABSTRACT

An imaging method for imaging a subject (16) including anisotropic or fibrous structures (102) includes acquiring a three-dimensional apparent diffusion tensor map (44, 162) of a region with some anisotropic structures (102). The apparent diffusion tensor map (44, 162) is processed to obtain ordered eigenvectors and eigenvalues (48, 166) of diffusion tensor map voxels. A three-dimensional fiber representation (54, 208) is tracked using the eigenvectors and eigenvalues (48, 166). The three-dimensional fiber representation (54, 208) is rendered as a hyperstreamline representation (238). An background image representation (328) is generated. A human-viewable display (344) is produced including the rendered hyperstreamline representation (238) superimposed on the generated image background representation (328).

30 Claims, 14 Drawing Sheets

DIFFUSION TENSOR MAGNETIC RESONANCE IMAGING INCLUDING FIBER RENDERING USING HYPERSTREAMLINES

BACKGROUND OF THE INVENTION

The present invention relates to the three-dimensional imaging arts. It particularly relates to the imaging, tracking, and displaying of neural fibers and fiber bundles by diffusion tensor magnetic resonance imaging (DT-MRI), and will be described with particular reference thereto. However, the invention will also find application in conjunction with the tracking and graphical rendering of other types of structures as well as with other imaging modalities such as single photon emission computed tomography imaging (SPECT), computed tomography (CT), positron emission tomography (PET), and the like.

Nerve tissue in human beings and other mammals includes neurons with elongated axonal portions arranged to form neural fibers or fiber bundles along which electrochemical signals are transmitted. In the brain, for example, functional areas defined by very high neural densities are typically linked by structurally complex neural networks of axonal fiber bundles. The axonal fiber bundles and other fibrous material are substantially surrounded by other tissue.

Diagnosis of neural diseases, planning for brain surgery, and other neurologically related clinical activities as well as research activities on brain functioning can benefit from non-invasive imaging and tracking of the axonal fibers and fiber bundles. In particular, diffusion tensor magnetic resonance imaging (DT-MRI) has been shown to provide image contrast that correlates with axonal fiber bundles. In the DT-MRI technique, diffusion-sensitizing magnetic field gradients are applied in the excitation/imaging sequence so that the magnetic resonance images include contrast related to the diffusion of water or other fluid molecules. By applying the diffusion gradients in selected directions during the excitation/imaging sequence, diffusion weighted images are acquired from which apparent diffusion tensor coefficients are obtained for each voxel location in image space.

Fluid molecules diffuse more readily along the direction of the axonal fiber bundle as compared with directions partially or totally orthogonal to the fibers. Hence, the directionality and anisotropy of the apparent diffusion coefficients tend to correlate with the direction of the axonal fibers and fiber bundles. Using iterative tracking methods, axonal fibers or fiber bundles can be tracked or segmented using the DT-MRI data.

However, fiber tracking results are difficult to interpret by doctors, clinicians, and other medical personnel. Axonal fiber bundles of interest are frequently located in the brain or other regions with very high nerve tissue densities. The tracked fiber typically overlaps, intertwines, crosses, or otherwise intermingles with other fibers/fiber bundles or other small anatomical structures. The relationship of the tracked fiber with the surrounding anatomy including other neural tissues can be an important aspect of the clinical analysis. Hence, there is a need for an improved image representation method and apparatus that emphasize selected features of the tracked fiber while placing the tracked fiber into context with the surrounding anatomy.

The present invention contemplates an improved apparatus and method which overcomes the aforementioned limitations and others.

SUMMARY OF THE INVENTION

According to one aspect of the invention, an imaging method is provided for imaging a subject including anisotropic structures. A three-dimensional apparent diffusion tensor map of at least a portion of the subject including at least some anisotropic structures is acquired. The apparent diffusion tensor at a voxel is processed to obtain eigenvectors and eigenvalues. A three-dimensional fiber representation is tracked using the eigenvectors and eigenvalues. The three-dimensional fiber representation is rendered as a hyperstreamline representation. A background image representation is generated. A human-viewable display is produced, including the hyperstreamline representation superimposed on the background image representation.

According to another aspect of the invention, an apparatus is disclosed for tracking fibrous structures in a subject. A magnetic resonance imaging scanner is configured to acquire diffusion-weighted imaging data. A reconstruction processor reconstructs the acquired diffusion-weighted imaging data into diffusion-weighted image representations. A diffusion tensor mapping processor constructs a diffusion tensor map by selectively combining selected diffusion-weighted image representations. An eigenvalues/eigenvectors processor obtains eigenvalues and eigenvectors of the diffusion tensor corresponding to a voxel. A voxel in the fiber tracking process can be substantially smaller than the acquired voxels. A fibrous structure tracking processor computes a fibrous structure representation based on the eigenvalues and eigenvectors and at least one starting voxel selection. A rendering processor computes a hyperstreamline representation of the fibrous structure representation. A display device displays the hyperstreamline representation in a human-viewable medium.

According to yet another aspect of the invention, an imaging method is provided for imaging a subject including fibrous structures. Diffusion tensor magnetic resonance imaging data of the fibrous structures is acquired. The diffusion tensor magnetic resonance imaging data is processed to extract a three-dimensional fiber representation of the fibrous structures. The three-dimensional fiber representation is rendered as one of: a tube with a circular cross-section having a diameter dimension; a tube with an elliptical cross-section having major and minor axis dimensions and an orientation dimension; a ribbon or helix having width and orientation dimensions; and a double ribbon or double helix including a first ribbon having first width and orientation dimensions and a second ribbon having second width and orientation dimensions.

One advantage of the present invention resides in its speed in determining fiber trajectories.

Another advantage of the present invention resides in providing intuitive graphical representations of tracked fiber image parameters that facilitate clinical interpretation and visualizing fiber orientation, diffusion tensor direction, anisotropy, and anatomical orientation.

Yet another advantage of the present invention resides in improved and intuitive color encoding that relates the tracked fiber direction with anatomical orientation.

Numerous additional advantages and benefits of the present invention will become apparent to those of ordinary skill in the art upon reading the following detailed description of the preferred embodiment.

BRIEF DESCRIPTION OF THE DRAWINGS

The invention may take form in various components and arrangements of components, and in various steps and arrangements of steps. The drawings are only for the purpose of illustrating preferred embodiments and are not to be construed as limiting the invention.

DETAILED DESCRIPTION OF THE PREFERRED EMBODIMENTS

Figure 1:
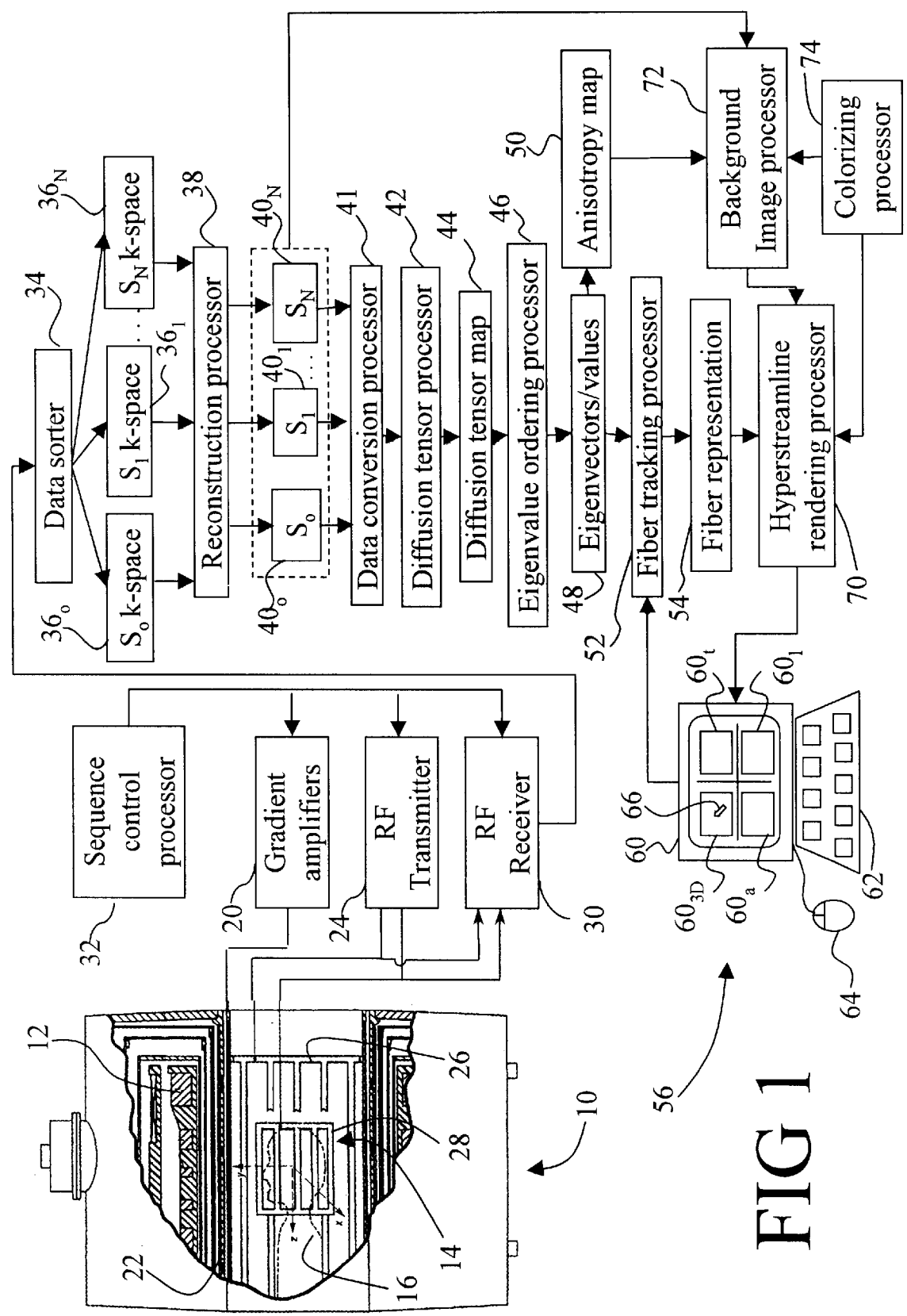
FIG. 1 schematically shows an exemplary magnetic resonance imaging (MRI) technique in accordance with one embodiment of the invention.

With reference to FIG. 1, a magnetic resonance imaging (MRI) scanner 10 typically includes superconducting or resistive magnets 12 that create a substantially uniform, temporally constant main magnetic field $B_o$ along a z-axis through an examination region 14. Although a bore-type magnet is illustrated in FIG. 1, the present invention is equally applicable to open magnet systems and other types of MRI scanners. Imaging :is conducted by executing a magnetic resonance excitation and readout sequence with the subject being imaged, e.g. a patient 16, placed at least partially within the examination region 14, typically with the region of interest at the magnet isocenter. For diffusion tensor MRI imaging of the brain region, the patient's head is preferably placed at the isocenter, as shown.

The magnetic resonance sequence includes a series of RF and magnetic field gradient pulses that are applied to the subject 16 to invert or excite magnetic spins, induce magnetic resonance, refocus magnetic resonance, manipulate magnetic resonance, spatially encode, flow or diffusion encode the magnetic resonance, saturate spins, and the like. More specifically, gradient pulse amplifiers 20 apply current pulses to a whole body gradient coil assembly 22 to create magnetic field gradients along x-, y-, and z-axes of the examination region 14. In diffusion-weighted MRI, selected magnetic field gradients are applied to provide motion-related contrast sensitive to motion of fluid molecules in selected directions.

An RF transmitter 24, preferably digital, applies RF pulses or pulse packets to a whole-body RF coil 26 to transmit RF pulses into the examination region 14. A typical RF pulse is composed of a packet of immediately contiguous pulse segments of short duration which taken together with each other and any applied gradients achieve a selected magnetic resonance manipulation. The RF pulses are used to saturate, excite resonance, invert magnetization, refocus resonance, or manipulate resonance in selected portions of the examination region.

For whole-body applications, the resulting resonance signals, generated as a result of a selected manipulation, are also picked up by the whole-body RF coil 26. Alternately, for generating RF pulses in limited regions of the subject, local RF coils are placed contiguous to the selected region. For example, in brain imaging an insertable head coil 28 is optionally employed.

Regardless of the RF coil configuration and the application thereof, the resultant RF magnetic resonance signals that are picked up by one or another of the RF coils is received and demodulated by an RF receiver 30, preferably a digital receiver. A sequence control processor 32 controls the gradient pulse amplifiers 20, the RF transmitter 24, and the RF receiver 30 to produce integrated MRI pulse sequence and readout waveforms that generate the magnetic resonance signals and optional echoes, provide appropriate encoding gradients to spatially and diffusion encode the resultant MR response, and coordinate MR pickup and receive operations.

The MRI sequence typically includes a complex series of magnetic field gradient pulses and/or sweeps generated by the gradient amplifiers 20 which along with selected RF pulses generated by RF coils 26, 28 result in magnetic resonance echoes that map into k-space. The resultant magnetic resonance data are sorted by a sorter 34 and stored in k-space memories 36. For diffusion tensor magnetic resonance imaging (DT-MRI), data is acquired without diffusion weighting, indexed 0, and with diffusion weighting in N directions, indexed 1 . . . N. Preferably, N≧6. The static and diffusion weighted data are acquired and sorted into corresponding k-space memories $36_o$, $36_1$, . . . $36_N$. The k-space data $36_o$, $36_1$, . . . $36_N$ for the static and each diffusion-weighted image is processed by a reconstruction processor 38, which is typically an inverse Fourier transform processor or other reconstruction processor known to the art, to produce reconstructed image representations $S_o$, $S_1$, . . . $S_N$ $40_o$, $40_1$, . . . $40_N$. Typically, the image $S_o$ $40_o$ is obtained without diffusion weighting.

For DT-MRI, apparent diffusion coefficients (ADC's) at selected directions are obtained by linear regression of images with different diffusion weightings. The ADC for each selected direction (i, j) is determined by acquiring a diffusion-weighted image $S_{i,j}$ diffusion weighted in the (i, j) direction. The diffusion-weighted image $S_{i,j}$ relates to the unweighted image $S_o$ $40_o$ according to:

$$S_{i,j} = S_o e^{-B \cdot ADC_{i,j}} \quad (1)$$

where B is a magnetic field parameter and $ADC_{i,j}$ is the apparent diffusion coefficient for the (i, j) direction. The ADC is calculated from equation (1) as:

$$ADC_{i,j} = -\frac{1}{B}\ln\left(\frac{S_{i,j}}{S_o}\right). \quad (2)$$

Beneficially, image contrast resulting from mechanisms other than the diffusion weighting, such as $T_1$, $T_2$, $T_2^*$, and like image contrast mechanisms, are substantially removed by the linear regression.

A data conversion processor 41 preferably performs selected post-reconstruction image processing, for example to ensure that color schemes and 3D models are not affected by the chosen scan technique. A diffusion tensor processor 42 calculates a plurality of ADC values on a per voxel basis according to equation (2) to construct a diffusion tensor map 44. Six diffusion directions typically provide sufficient information to construct the diffusion tensor at each voxel.

Figure 2:
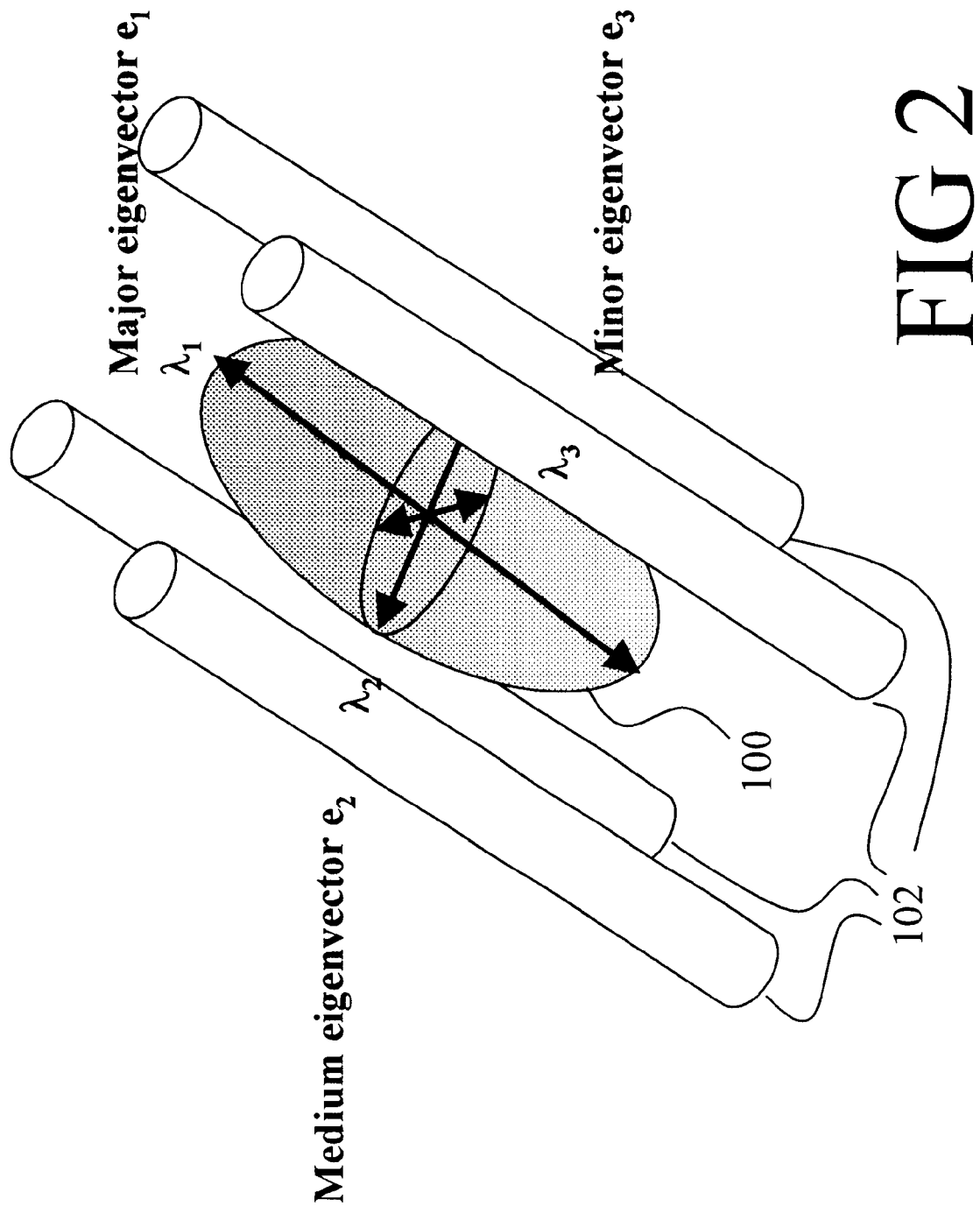
FIG. 2 diagrammatically illustrates the eigenvectors and eigenvalues of the diffusion coefficient tensor and their relationship with axonal fibers or fiber bundles.

With continuing reference to FIG. 1 and with further reference to FIG. 2, an eigenvector/eigenvalue ordering processor 46 orders the diffusion tensor eigenvectors and eigenvalues for a voxel to obtain ordered eigenvectors and eigenvalues 48. As seen in FIG. 2, the ordered eigenvalues $\lambda_1$, $\lambda_2$, $\lambda_3$ (ordered from largest to smallest eigenvalue) and the corresponding eigenvectors $e_1$, $e_2$, $e_3$ of the diffusion tensor have useful physical significance. The largest eigenvalue is designated in FIG. 2 as $\lambda_1$. The corresponding eigenvector $e_1$ is called the major eigenvector, and aligns with the spatial direction having the highest diffusion coefficient. The remaining eigenvalues $\lambda_2$, $\lambda_3$ have corresponding eigenvectors $e_2$, $e_3$ called the medium and minor eigenvectors in FIG. 2. These eigenvectors $e_2$, $e_3$ are orthogonal to $e_1$ and align with spatial directions having lower diffusion coefficients. The relative values of the eigenvalues $\lambda_1$, $\lambda_2$, $\lambda_3$ are indicative of the spatial orientation and magnitude of the diffusion tensor anisotropy.

With continuing reference to FIG. 2, the eigenvectors and eigenvalues are geometrically representable by an ellipsoid 100 whose long axis aligns with eigenvector $e_1$, i.e. with the direction of the highest apparent diffusion coefficient. The deviation of the ellipsoid 100 from a perfect sphere is representative of the anisotropy of the diffusion tensor. An anisotropic diffusion coefficient tensor can reflect the influence of neural fiber bundles 102 which tend to inhibit diffusion in directions partially or totally orthogonal to the fibers 102, e.g. the directions of eigenvectors $e_2$, $e_3$. In contrast, diffusion parallel to the fibers 102, i.e. channeled along the direction of the major eigenvector $e_1$, is enhanced and larger than along the $e_2$, $e_3$ directions.

With returning reference to FIG. 1, an anisotropy map 50, such as a fractional anisotropy map known to the art or another anisotropy image map that emphasizes the anisotropy magnitude, is optionally calculated from the eigenvectors and eigenvalues 48. In a suitable embodiment, an anisotropy parameter is calculated on a per voxel basis according to:

$$FA = \begin{cases} \sqrt{\dfrac{3\sum\limits_{i=1,2,3}(\lambda_i - \lambda_{avg})^2}{2\sum\limits_{i=1,2,3}\lambda_i^2}}, & \sqrt{\dfrac{1}{3}(\lambda_1^2 + \lambda_{2i}^2 + \lambda_3^2)} \geq 0.10 \\ 0.10 & \sqrt{\dfrac{1}{3}(\lambda_1^2 + \lambda_{2i}^2 + \lambda_3^2)} < 0.10 \end{cases} \quad (3)$$

where $$\lambda_{avg} = \frac{\lambda_1 + \lambda_2 + \lambda_3}{3}. \quad (4)$$

An anisotropy map using the anisotropy parameter described by equations (3) and (4) has been found to be particularly suitable for use in conjunction with diffusion fiber tracking. As is known to those skilled in the art, the anisotropy map 50 provides a convenient image representation of the anisotropy magnitude. However, it does not include directional information, which makes it unsuitable for tracking or segmenting selected axonal fiber bundles from the large number of crossing, branching, intertwined, or otherwise overlapping fibers and fiber bundles in a neurologically complex region such as the brain.

With continuing reference to FIG. 1, a fiber tracking processor 52 segments or tracks axonal fibers or fiber bundles in the diffusion tensor map 44 to produce a fiber representation which is stored in a fiber representation memory 54. The fiber tracking processor 52 initiates tracking at one or more seed voxels selected by a user.

In a suitable selection process, the user operates a user interface device 56 such as a personal computer or workstation including a graphical display 60, a keyboard 62, a mouse or other pointing device 64, and/or similar input or output elements. The display 60 shows an image representation of the subject 16, for example a 3D rendered image 60$_{3D}$ and three orthogonal slices 60$_a$, 60$_t$, 60$_1$ which intersect at an intersection point that is adjustable by the pointing device 64. The image can be one of the diffusion weighted images, the $S_o$ image 40$_o$, the anisotropy map 50, or the like. The 3D rendering 60$_{3D}$ also shows a superimposed interactive pointer icon 66 or other graphical selection tool corresponding to the intersection point which is operable by the user through the pointing device 64, the keyboard 62, or other input device to select one or more seed voxels.

Figure 3:
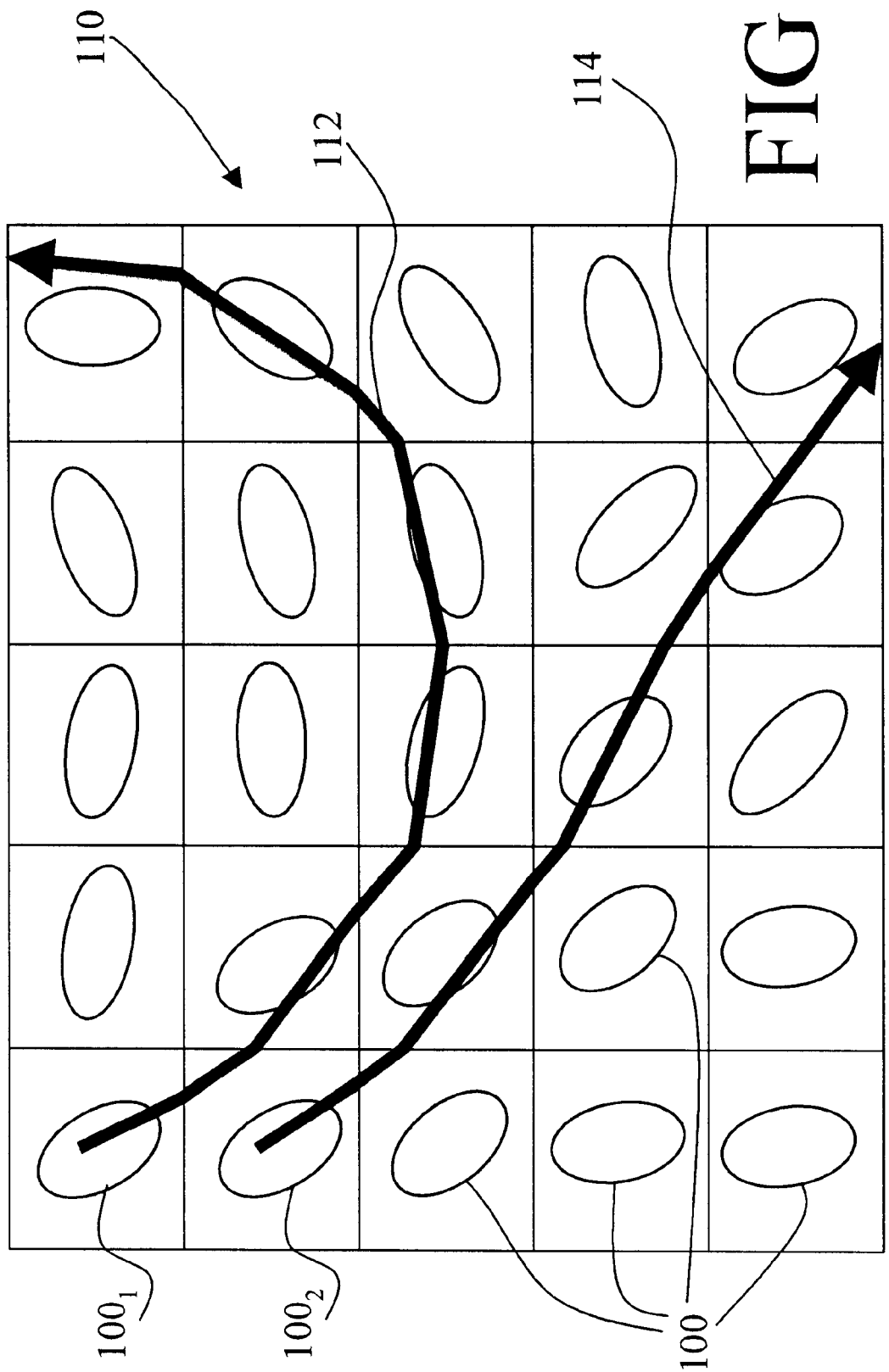
FIG. 3 is a two-dimensional diagrammatical representation of the fiber tracking.

With continuing reference to FIG. 1, returning reference to FIG. 2, and with further reference to FIG. 3 which shows an exemplary two-dimensional diffusion coefficient eigenvector/eigenvalue map 110 in which the anisotropy is geometrically represented by ellipsoids 100, the fiber tracking processor 52 iteratively tracks a fiber using a tracking direction given by the major eigenvector $e_1$ of the diffusion tensor of the seed voxel and each subsequent voxel. FIG. 3 shows a first fiber representation track 112 which starts at seed voxel 100$_1$, and a second fiber representation track 114 which starts at seed voxel 100$_2$.

Although unidirectional tracking is shown in FIG. 3, it will be appreciated that tracking can optionally occur bi-directionally, i.e. extending in both the $e_1$ and the $-e_1$ directions, to provide more complete fiber tracking. Furthermore, although an exemplary two-dimensional array of voxels is shown in FIG. 3, it will be appreciated that the tracking will generally occur three-dimensionally using the three-dimensional diffusion tensor map 44.

With continuing reference to FIG. 1, the fiber representation 54 is graphically formatted by a hyperstreamline rendering processor 70 for user-viewable display on the graphical display device 60 or another output device. The fiber representation 54 is preferably rendered using a hyperstreamline which tracks the fiber direction corresponding with the major eigenvector $e_1$ direction and which includes a circular or elliptical tubular cross-section, a single ribbon or helical cross-section, a double ribbon or helical cross-section, or other orthogonal extent that is representative of the diffusion anisotropy. Preferably, the hyperstreamline is rendered superimposed on a background image drawn by a background image processor 72. The background image can be constructed from the anisotropy map 50 (or a portion thereof), the static image 400, one of the diffusion weighted images 40$_1$, . . . 40$_N$, a uniform black or white screen, or the like. Preferably, the hyperstreamline rendering processor 70 produces a 3D rendering which can be rotated, resized, or otherwise manipulated by the user via the mouse 64, keyboard 62, or other input device.

The hyperstreamline rendering processor 70 preferably colorizes the rendered fiber representation 54. For example, the rendered hyperstreamline can include a color coding based on anatomical orientation of the hyperstreamline direction, diffusion anisotropy of the fiber voxels, or the like, or can be colored using a bright yellow or other highly distinguishable color. The background image produced by the background image processor 72 is also optionally colored. To improve efficiency of the rendering, a dedicated colorizing processor 74 is optionally provided, which communicates with the hyperstreamline rendering processor 70 and with the background image processor 72.

Although the fiber tracking processor 52 and the hyperstreamline rendering processor 70 are separately shown in FIG. 1, it will be appreciated that the fiber tracking 52 and the hyperstreamline rendering 70 can occur substantially concurrently. Both steps involve computations and manipulations of the eigenvectors and eigenvalues 48, and so improved computational efficiency is optionally obtained by at least partially integrating the fiber tracking and the hyperstreamline rendering processes 52, 70.

Figure 4:
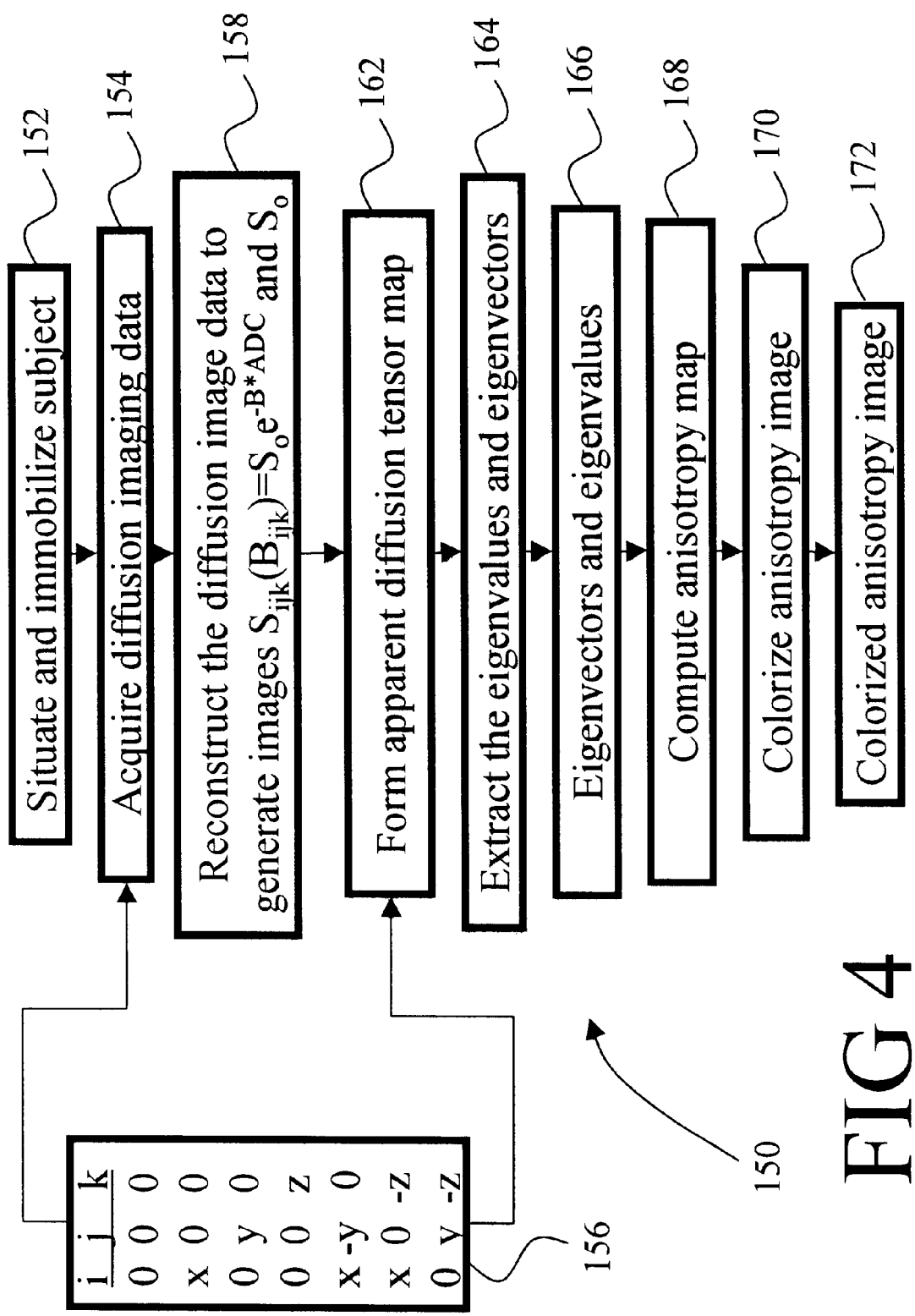
FIG. 4 shows an exemplary process for acquiring diffusion tensor magnetic resonance imaging data and for computing an apparent diffusion coefficient tensor map, eigenvalues and eigenvectors, and a fractional anisotropy map.

With reference to FIG. 4, a suitable method 150 for acquiring diffusion tensor magnetic resonance imaging (DT-MRI) data and for generating related spatial mappings and image representations is described. A subject is situated and immobilized within a magnetic resonance imaging (MRI) scanner in a step 152. Because the DT-MRI imaging includes acquisition of a large number of images over a substantial period of time, the subject is preferably immobilized to minimize motion blurring and motion-induced image misregistration between image acquisitions.

The DT-MRI imaging data are acquired in a step 154 using imaging sequences such as spin-echo sequences which include additional magnetic field gradient pulses that produce the selected diffusion weighting. Preferably, a multiple-echo sequence is used in which images are acquired with several diffusion weightings 156 corresponding to selected apparent diffusion coefficient (ADC) components of the diffusion coefficient tensor. Six apparent diffusion coefficients are generally sufficient to describe the tensor. In the illustrated embodiment, six diffusion weightings 156 are collected, with magnetic field gradient pulses applied in the (x, 0, 0), (0, y, 0), (0, 0, z), (x, −y, 0), (x, 0, −z), and (0, y, −z) directions, along with an unweighted image (0, 0, 0). However, other combinations of diffusion weighting can be used instead. Using a multiple-echo sequence advantageously reduces data acquisition time and minimizes motion-induced blurring or misregistration across images. To improve the signal-to-noise ratio, data for a plurality of redundant images are preferably collected for each diffusion weighting. The imaging sequence also optionally includes additional RF pulses or magnetic field gradient pulses or sweeps to compensate for magnetic field gradient-induced eddy currents and other imaging artifacts.

Image data collected in the step 154 is reconstructed in a step 158 to form diffusion weighted image reconstructions $S_o$ and $S_{ijk}$ where ijk indicates the various weightings 156. An inverse Fourier transform reconstruction known to the art is suitably used, although other reconstruction methods can also be employed.

With the diffusion-weighted images acquired, and reconstructed, the apparent diffusion coefficients (ADC's) are calculated according to equation (2) and the apparent diffusion coefficient tensor map is constructed in a step 162. The eigenvalues and eigenvectors are extracted in a step 164 to obtain eigenvalues and eigenvectors 166.

Optionally, an anisotropy (FA) map is computed in a step 168 in accordance with equations (3) and (4). The anisotropy map is preferably colorized in a step 170 to obtain a colorized anisotropy image 172 for display to an associated user. The anisotropy image 172 provides a convenient medium for the user to select regions of interest for fiber tracking.

Figure 5:
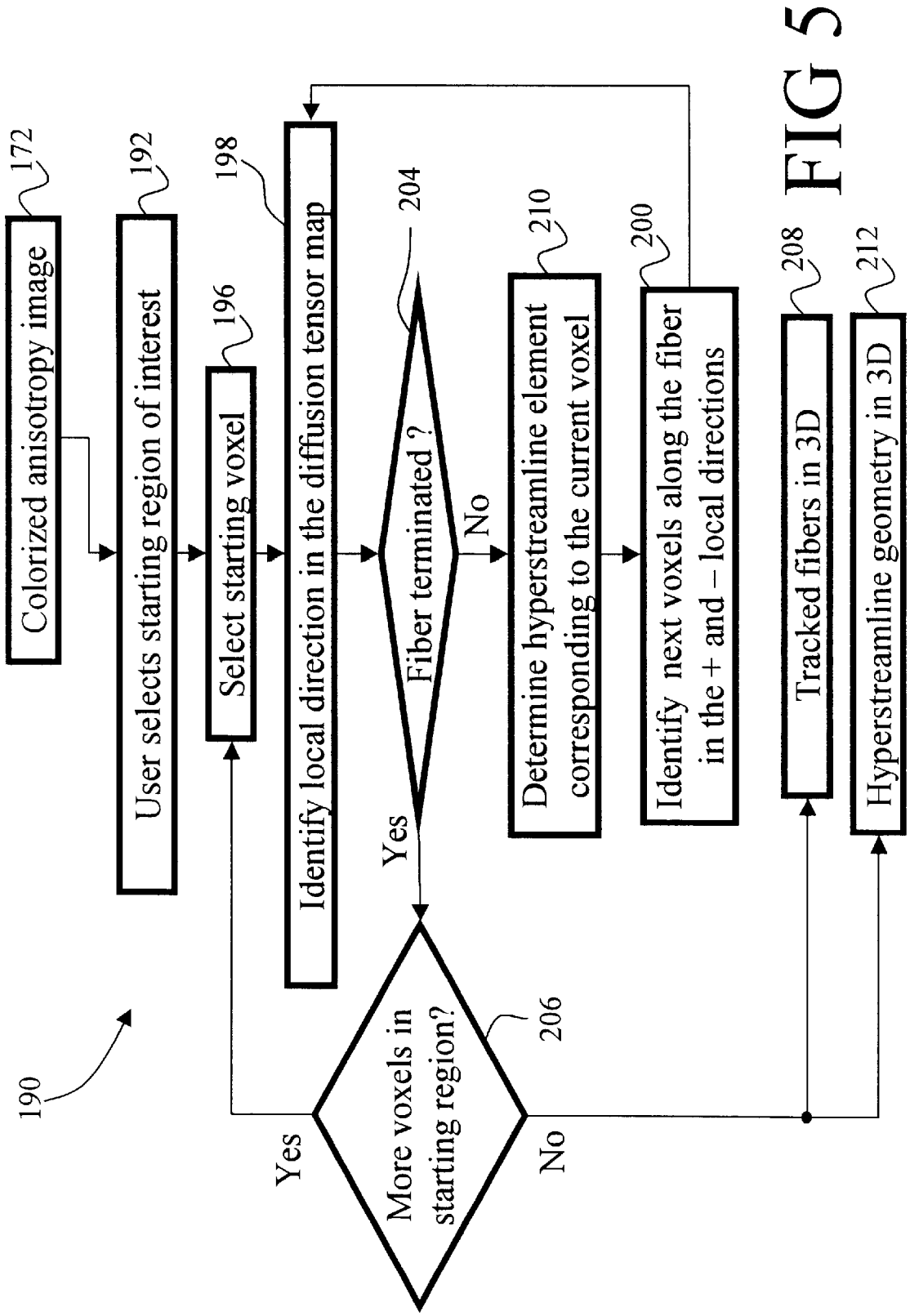
FIG. 5 shows an exemplary fiber tracking process.

With reference to FIG. 5, a suitable method 190 for tracking fibers in the DT-MRI image is described. In a step 192, the user selects a starting region of interest. In a suitable embodiment, the selection 192 is made with reference to the anisotropy map 172 optionally obtained in the DT-MRI imaging method 150 of FIG. 4. The selection is preferably indicated by the user graphically using a mouse pointer or other graphical selection device. The selected region of interest can be a single voxel, a planar region of voxels, or a three-dimensional region of voxels. Optionally, the user can also select an ending region of interest. Selection of an ending region of interest is typically useful for tracking fibers extending between two functional brain regions of deep white matter.

A starting voxel within the selected starting region of interest is selected in a step 196. Beginning with this voxel, a local direction is identified in a step 198 corresponding to the major eigenvector $e_1$ direction (see FIG. 2). In a step 200, next voxels are identified which are nearby the current voxel along the local direction (see FIG. 3). In a preferred embodiment, both positive and negative (bi-directional) tracking is performed by identifying next voxels in both positive and negative local directions. As the tracking progresses bi-directionally, a positive fiber end is grown by successively identifying voxels in the positive local direction while a negative fiber end is grown by successively identifying voxels in the negative local direction. Unidirectional fiber tracking is also contemplated for certain situations such as tracking a fiber extending away from a large, dense region of deep white matter.

The method 190 iteratively repeats the steps 198, 200 to grow the tracked fiber either uni-directionally or bi-directionally. Preferably, a decision step 204 within the iterative loop checks for a termination of a progressing fiber end. One suitable fiber termination criterion includes a fractional anisotropy or other anisotropy parameter below a selected value, e.g. at or below the FA=0.10 threshold used in equation (3). Since a low anisotropy corresponds with a highly isotropic diffusion tensor, it is reasonable to associate an anisotropy value that drops below a selected threshold with the terminal point of a tracked fiber.

Another suitable fiber termination criterion is a change in local direction between successive voxels which is greater than a selected angle. A large change in local direction is likely to correspond to a fiber branching point. Optionally, instead of terminating at such an apparent branching point, a new region of interest is defined at or around the branching point and the tracking process 190 is repeated for the new region of interest to track the branching fibers or fiber bundles.

Yet another suitable fiber termination criterion is entrance of the progressing fiber into an ending region of interest that was selected by the user in the step 192. Various combinations of the exemplary terminating criteria described herein, and/or addition or substitution of other suitable terminating criteria, are also contemplated.

If the decision step 204 indicates that the fiber has terminated, the method preferably checks whether all voxels of the region of interest have been visited in a decision step 206. If unvisited voxels still exist in the region of interest, another starting voxel is selected in the step 196 and the tracking steps 198, 200, 204 are iteratively repeated. Repetitive iterative tracking starting at each voxel in the starting region of interest collectively produces a three-dimensional tracked fibers representation 208 representative of one or more tracked fibers or fiber bundles.

In a preferred embodiment, the hyperstreamline elements are iteratively calculated during the tracking 190 in a step 210. Combining the fiber tracking with the determining of the hyperstreamline elements is beneficial when using the tracking method 190 because the eigenvalues and eigenvectors of each voxel of the tracked fiber are obtained. Since the eigenvectors and eigenvalues are also used in constructing the hyperstreamline, improved calculational efficiency can be obtained. As each voxel of the tracked fiber is processed, a corresponding hyperstreamline element is computed in a step 210. In this embodiment, the tracking process 190 also outputs the hyperstreamline geometry 212.

Typically, the hyperstreamline will include a direction corresponding with the major eigenvector $e_1$ direction, a cross-sectional geometry oriented based on the medium and minor eigenvectors $e_2$, $e_3$, cross-sectional dimensions determined by the eigenvalues $\lambda_1$, $\lambda_2$, $\lambda_3$ or a function thereof (such as the fractional anisotropy), and optionally a color encoding based on the major eigenvector direction $e_1$, the fractional anisotropy, or the like.

Although the step 210 of calculating the hyperstreamline elements is shown in FIG. 5 as integrated into the fiber tracking process 190, it will be appreciated that the hyperstreamline rendering can also be performed after the fiber tracking. For example, if the user decides to change rendering parameters such as the color or cross-sectional geometry of the hyperstreamline, the hyperstreamline elements are re-computed. It is also contemplated to employ other methods for the fiber tracking, such as performing tracking starting at each voxel of the image and then selecting certain tracked fibers for rendering based on selection criteria. In this case, rendering hyperstreamline representations of each fiber during the tracking is disadvantageous since only selected fibers will be displayed.

Figure 6:
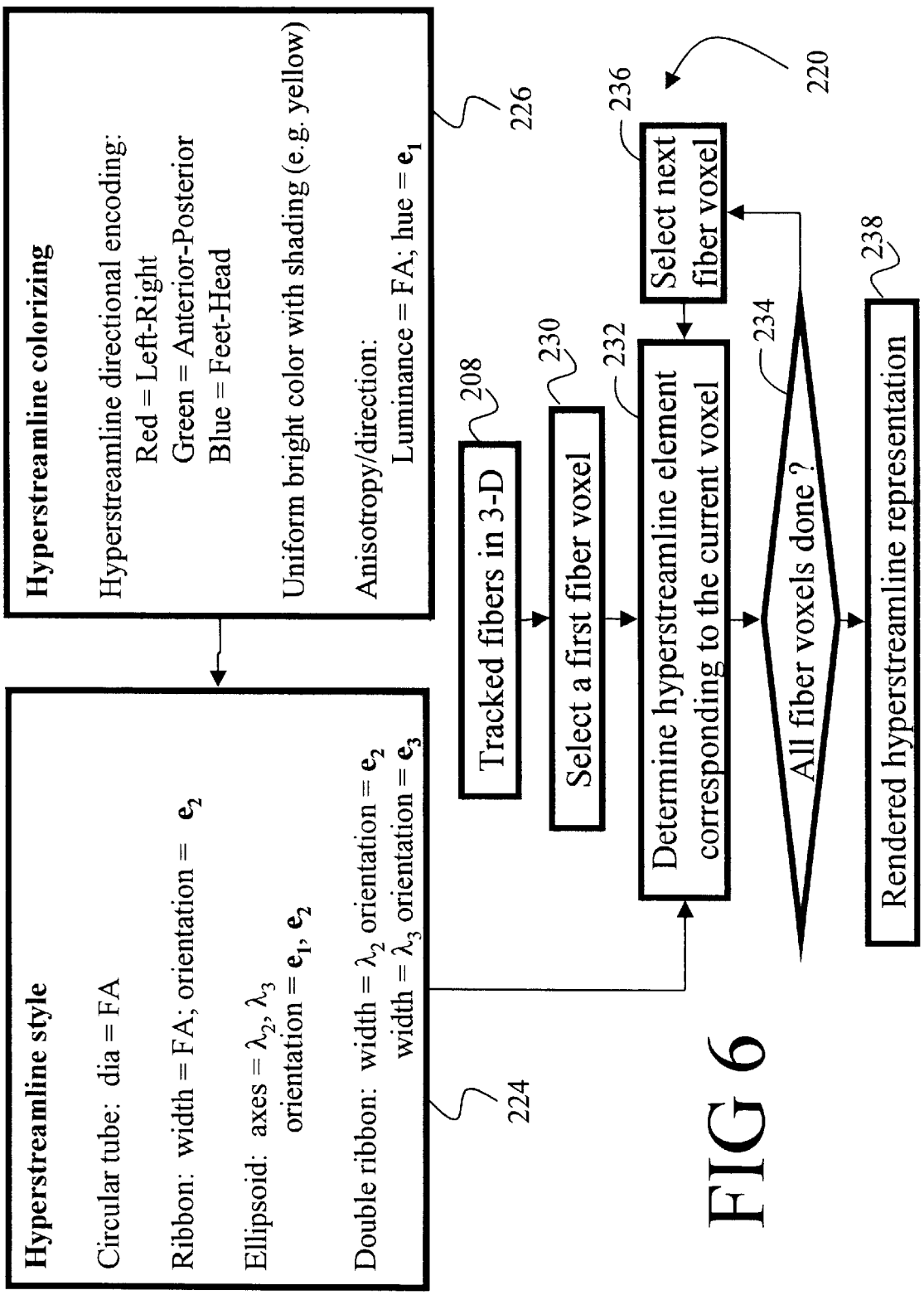
FIG. 6 shows an exemplary method for rendering a hyperstreamline representation.

With reference to FIG. 6, a suitable method 220 for rendering a hyperstreamline representation of the three-dimensional tracked fibers representation 208 from the memory 54 (FIG. 1) is described. For the hyperstreamline rendering, the user preferably selects from among a plurality of hyperstreamline styles 224 including a circular tube hyperstreamline style, an ellipsoidal tube hyperstreamline style, and single and double ribbon hyperstreamline styles. The ribbon hyperstreamline style is also known as a helix hyperstreamline. The user also preferably selects from a plurality of hyperstreamline colorizing options 226 including a uniform high-contrast color such as a bright yellow hyperstreamline coloring, a hyperstreamline directional color encoding, and a combined anisotropy/directional color encoding. Default style and colorizing options (not shown) are preferably defined and employed if the user does not explicitly select these options.

In a step 230, a first voxel of the fiber representation 208 is selected. In a step 232, a hyperstreamline element is computed. Typically, the hyperstreamline element includes a hyperstreamline direction corresponding to the fiber direction (which typically corresponds with the direction of the major eigenvector $e_1$). The hyperstreamline also includes a cross-section which is circular, ellipsoidal, planar (e.g., a ribbon or helical cross-section), multi-planar (e.g., a double ribbon or helical cross-section), or otherwise shaped, with a size dimension or dimensions corresponding to one or more eigenvalues or a functional relationship of eigenvalues, and an orientation corresponding with the orientation of the medium and/or minor eigenvector directions. The hyperstreamline is also preferably colored using either a uniform single color such as bright yellow, or using a plurality of colors, hues, shadings, and intensities that represent selected anisotropic parameters, anatomical directions, or the like.

In steps 234, 236, a next voxel is identified and the hyperstreamline element calculating step 232 is repeated until the 3-D tracked fibers are fully rendered as a hyperstreamline representation 238. If the user later selects a different hyperstreamline rendering, e.g. using different parameters selected from the parameter options 224, 226, the process 220 is repeated.

Figure 7:
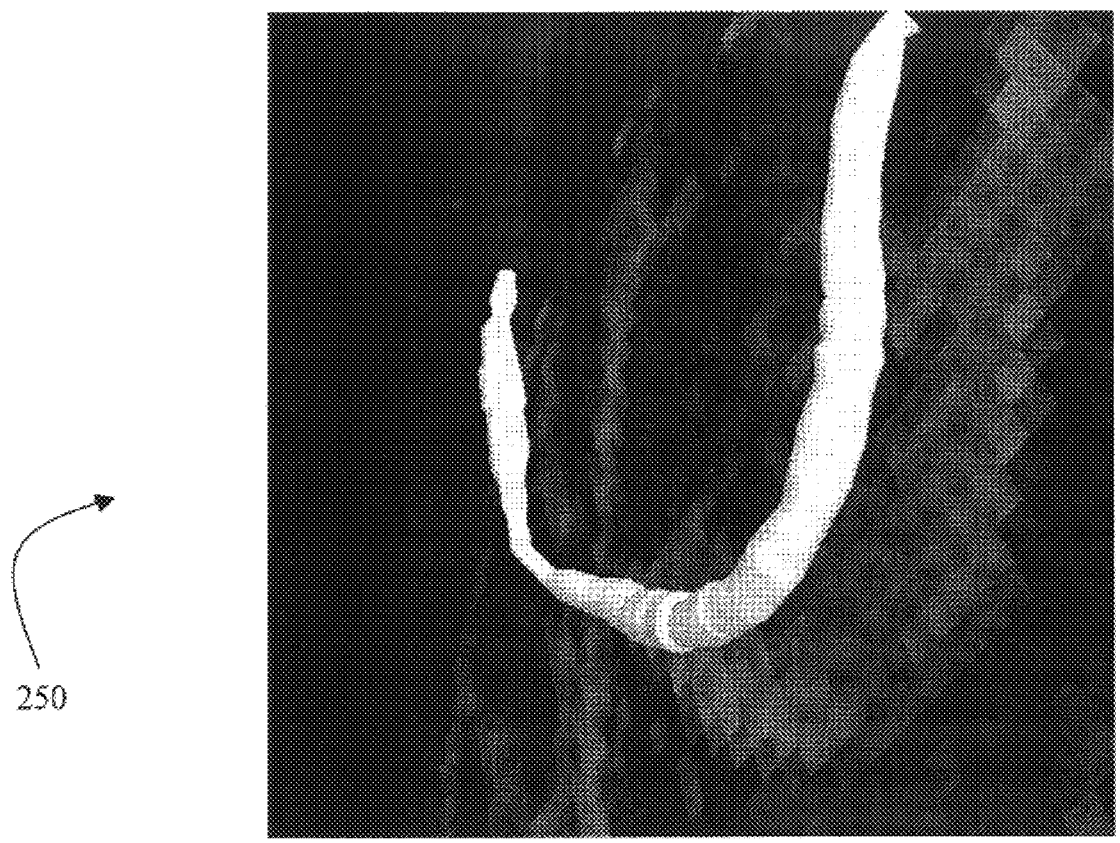
FIG. 7 shows an exemplary circular tubular hyperstreamline representation.

With continuing reference to FIG. 6 and with further reference to FIG. 7, a suitable circular tube hyperstreamline representation rendering of the three-dimensional tracked fibers representation 208 is described. FIG. 7 shows an exemplary circular tube hyperstreamline representation rendering 250 in which the tube cross-section is circular with a diameter at each point along the fiber representation corresponding to a fractional anisotropy (FA) or other anisotropy parameter of the corresponding voxel, such as is given in equations (3) and (4). The thicker portions of the circular tubular hyperstreamline representation 250 represent regions of greater anisotropy, which can correspond to regions of greater axonal fiber density or fiber bundle thickness.

Figure 8:
FIG. 8 shows an exemplary circular tubular hyperstreamline representation with a smaller scaling factor compared with the hyperstreamline of FIG. 7.

With continuing reference to FIGS. 6 and 7 and with further reference to FIG. 8, the user preferably selects a scaling factor for scaling the tubular diameter with the fractional anisotropy or other anisotropy parameter. FIG. 7 shows a tubular hyperstreamline representation 250 with a relatively large scaling factor, while FIG. 8 shows a similar tubular hyperstreamline representation 260 with a relatively smaller scaling factor. The user will typically select a smaller scaling factor to facilitate resolving closely spaced fibers or fiber bundles; while, a larger scaling factor facilitates in resolving variations in the fractional anisotropy along the tracked fiber 208. Variations in the fractional anisotropy along the fiber can correspond to a varying fiber bundle density, fiber bundle thickness, or other axonal fiber bundle features of clinical interest.

Figure 9:
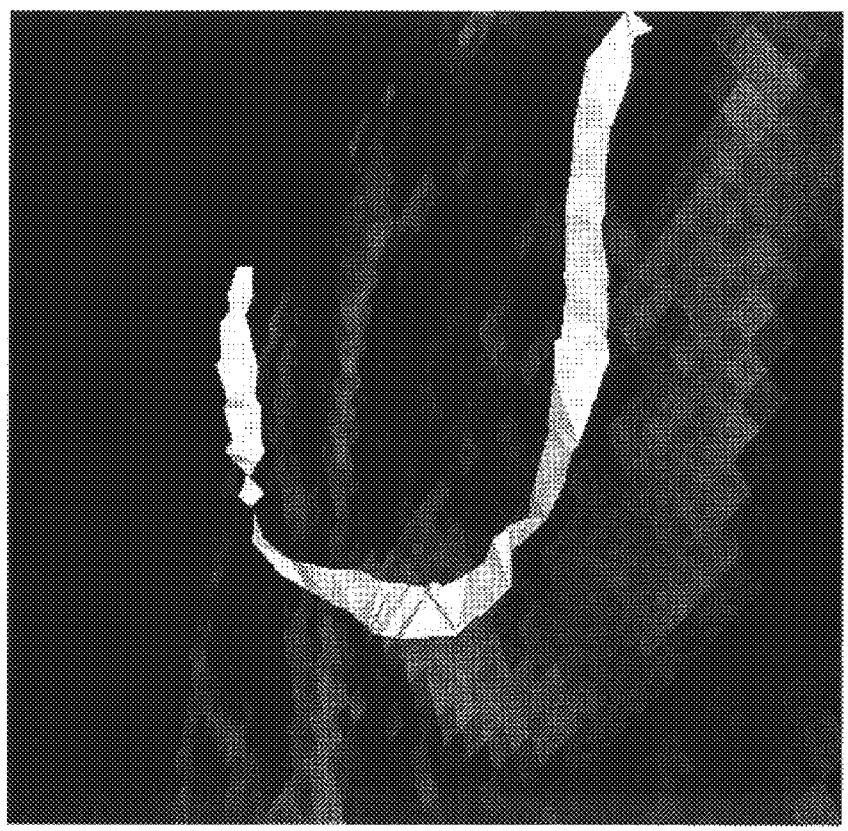
FIG. 9 shows an exemplary single-ribbon or helix hyperstreamline representation.

With continuing reference to FIG. 6 and with further reference to FIG. 9, a suitable single-ribbon or single-helix hyperstreamline representation rendering of the three-dimensional tracked fibers representation 208 is described. FIG. 9 shows an exemplary single-ribbon or helix hyperstreamline representation rendering 270 in which the ribbon width at each point along the fiber representation corresponds with a fractional anisotropy (FA) or other anisotropy parameter of the corresponding voxel, such as is given in equations (3) and (4), while the ribbon orientation in three-dimensional space corresponds with the direction of the medium eigenvector $e_2$ of the diffusion tensor at the corresponding voxel (see FIG. 2). The ribbon width has substantially the same physical significance as the tubular diameter of the circular tubular hyperstreamline representations 250, 260.

The ribbon orientation, corresponding with the medium eigenvector $e_2$, is such that the ribbon extends along the $e_2$ direction. Since the medium eigenvector $e_2$ is typically larger than the minor eigenvector $e_3$, the ribbon hyperstreamline representation 270 extends laterally in the direction, perpendicular to the fiber, that has the largest apparent diffusion coefficient. This direction can have various physical significances, such as indicating a direction of smaller branching fibers, indicating a "flatness" of the fiber bundle width or density, or the like.

Figure 10:
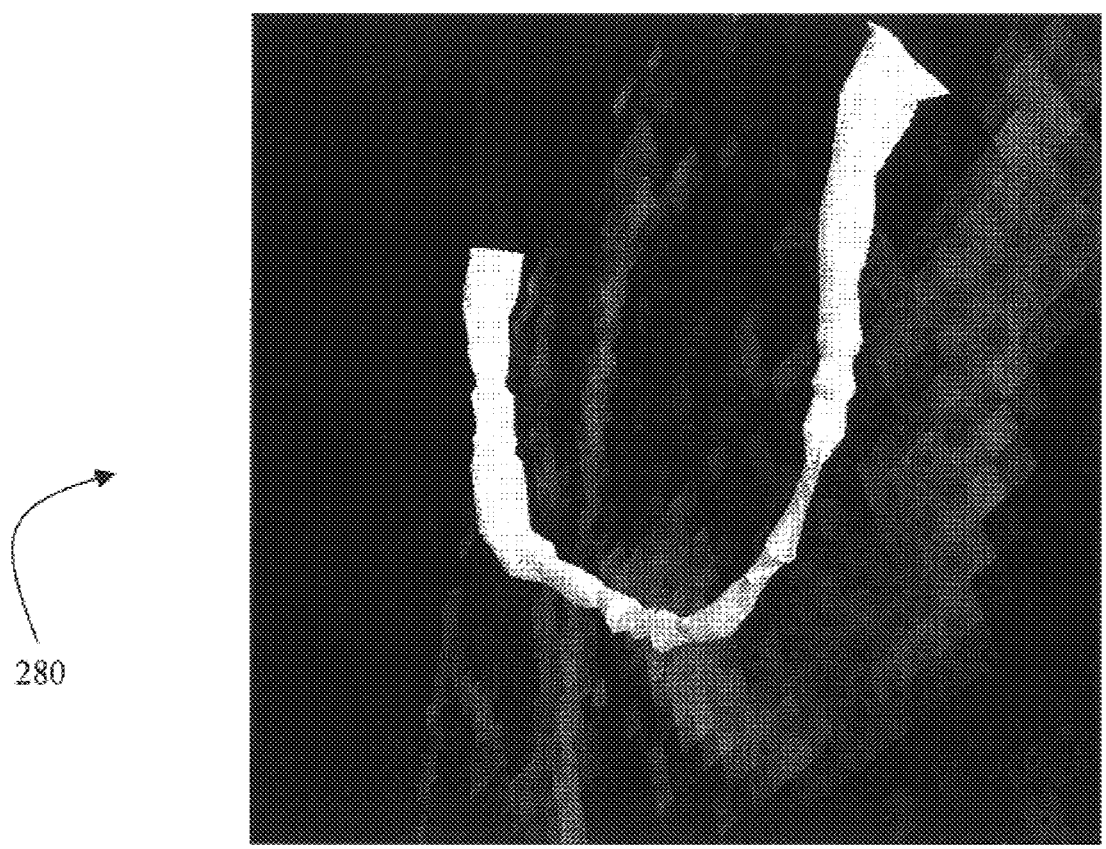
FIG. 10 shows an exemplary ellipsoidal tubular hyperstreamline representation.

With continuing reference to FIG. 6 and with further reference to FIG. 10, a suitable ellipsoidal hyperstreamline representation rendering of the three-dimensional tracked fibers representation 208 is described. FIG. 10 shows an exemplary ellipsoidal hyperstreamline representation rendering 280 in which the major and minor cross-sectional elliptical axes correspond with the medium and minor diffusion tensor eigenvalues $\lambda_2$ and $\lambda_3$, respectively, (see FIG. 2) at the corresponding voxel while the orientation of the major and minor axes in three-dimensional space correspond with the directions of the medium and minor diffusion tensor eigenvectors $e_2$ $e_3$, respectively (see FIG. 2) at the corresponding voxel.

The shape and orientation of the ellipsoidal hyperstreamline 280 provides independent visual indications of the medium and minor diffusion tensor eigenvalues $\lambda_2$ and $\lambda_3$ and orientations of the corresponding eigenvectors $e_2$ and $e_3$. Such ellipsoidal hyperstreamline visualizations can correlate with the circularity or flatness of the fiber bundle width or density, can indicate the presence and orientation of fiber branching points, and so forth. The ellipsoidal hyperstreamline 280 can suffer from noise propagation in the $e_2$ and/or $e_3$ directions.

Figure 11:
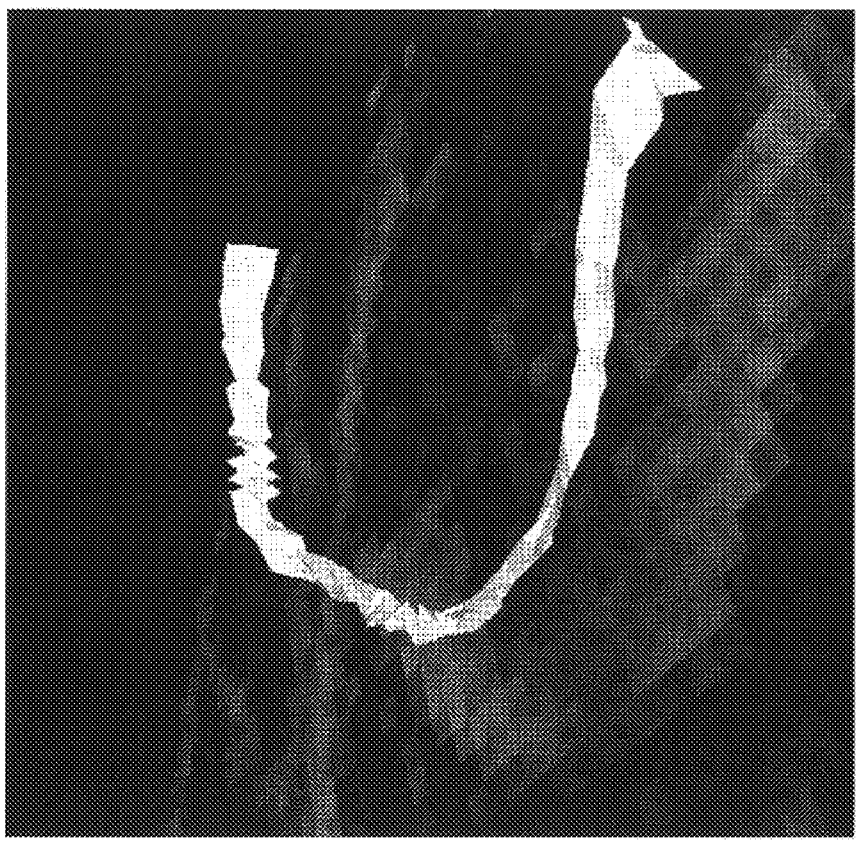
FIG. 11 shows an exemplary double-ribbon or double-helix hyperstreamline representation.

With continuing reference to FIG. 6 and with further reference to FIG. 11, a suitable double-ribbon or double-helical hyperstreamline representation rendering of the three-dimensional tracked fibers representation 208 is described. FIG. 11 shows an exemplary double-ribbon or double-helix hyperstreamline representation rendering 290 in which the widths of the two ribbons correspond with the medium and minor diffusion tensor eigenvalues $\lambda_2$ and $\lambda_3$, respectively, at the corresponding voxel. (See FIG. 2). The orientations of the ribbons in three-dimensional space correspond with the directions of the medium and minor diffusion tensor eigenvectors $e_2$ $e_3$, respectively, at the corresponding voxel.

The shape and orientation of the double-ribbon 290 provides independent visual indications of the medium and minor diffusion tensor eigenvalues $\lambda_2$ and $\lambda_3$ and directions of corresponding eigenvectors $e_2$ and $e_3$. These shapes and orientations can correlate with the circularity or flatness of the fiber bundle thickness or density, can indicate the presence and orientation of fiber branching points, and so forth. The double-ribbon hyperstreamline 280 can suffer from noise propagation in the $e_2$ and/or $e_3$ directions.

Figure 12A:
FIG. 12A shows an exemplary circular tubular hyperstreamline representation in which the tubular dimension is not scaled based on the voxel size.
Figure 12B:
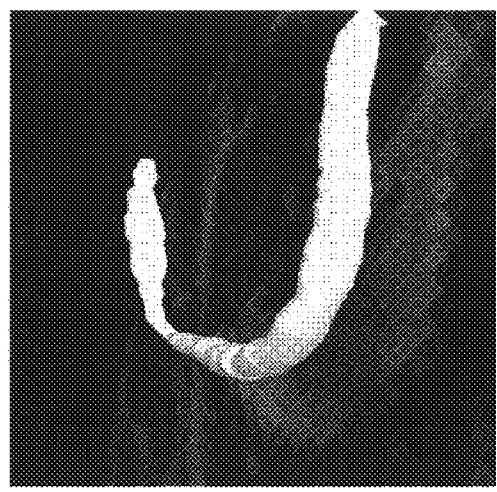
FIG. 12B shows an exemplary circular tubular hyperstreamline representation in which the tubular dimension is scaled based on the voxel size.

With continuing reference to FIG. 6 and with further reference to FIGS. 12A and 12B, the hyperstreamline is optionally constructed without reference to the voxel size, as shown in the exemplary circular tubular hyperstreamline 300 of FIG. 12A. Alternatively, the hyperstreamline is optionally constructed with the tube or ribbon scaled relative to the voxel size, as shown in the exemplary circular tubular hyperstreamline 310 of FIG. 12B. Scaling based on the voxel size helps the user determine whether rendered hyperstreamline features include resolution-related artifacts. However, scaling based on the voxel size can complicate comparisons of portions of the hyperstreamline acquired with different resolutions.

The various hyperstreamline geometries described with reference to FIGS. 6–12B are exemplary only. Other types of hyperstreamline shapes and cross-sectional dimensions are also contemplated based on other diffusion tensor parameters and functional parameter relationships.

With continuing reference to FIG. 6, a plurality of hyperstreamline colorizing options 226 are preferably available for selection by the user. In one suitable colorizing option, a uniform high-contrast color is used for the fiber hyperstreamline representation 238. In practice, a bright yellow uniform color has been found to be particularly suitable for producing high-contrast hyperstreamline representations on a variety of backgrounds. Preferably, a shading techniques such as those known in the 3D rendering arts is used in the uniform high-contrast color hyperstreamline rendering to enhance its orientation in 3D for the user. Of course, other colors besides bright yellow can be selected which may be suitable for specific backgrounds.

In another suitable colorizing option, a hyperstreamline directional color encoding is used in which the hyperstreamline portions are colored based on the anatomical direction of the rendered fiber portion. In one suitable encoding scheme, hyperstreamline portions running generally left-right are colored red, hyperstreamline portions running generally in the anterior-posterior are colored green, and hyperstreamline portions running generally in the feet-head direction are colored blue. Of course, other hyperstreamline directional color encoding schemes can be used. However, preferably a hyperstreamline directional color encoding scheme is selected and uniformly applied, so that in rotatable 3-D renderings the hyperstreamline colorizing provides the user with a reliable reference relative to the anatomical orientation of the image regardless of the rotation of the 3-D rendering.

In yet another suitable colorizing option, a combined anisotropy/direction encoding is employed. In this scheme, the color or hue is selected based on the major eigenvector direction $e_1$ (see FIG. 2). Since the preferred fiber tracking takes the fiber as running along the major eigenvector direction $e_1$ direction, this color encoding is substantially equivalent to color-encoding based on the fiber or hyperstreamline direction. However, for other fiber tracking methods the fiber and major eigenvector directions may differ.

In the combined anisotropy/direction encoding scheme, the intensity or luminance of each voxel encodes the fractional anisotropy or other diffusion tensor-related parameter. In this way, the user receives both an anatomical direction reference through the colorizing hue and an indication of the fractional anisotropy or other diffusion tensor-related parameter through the luminance.

The described colorizing options are exemplary only. Additional and/or different colorizing options are also contemplated for highlighting and/or color encoding selected aspects of the tracked fiber hyperstreamline representation 238.

Figure 13:
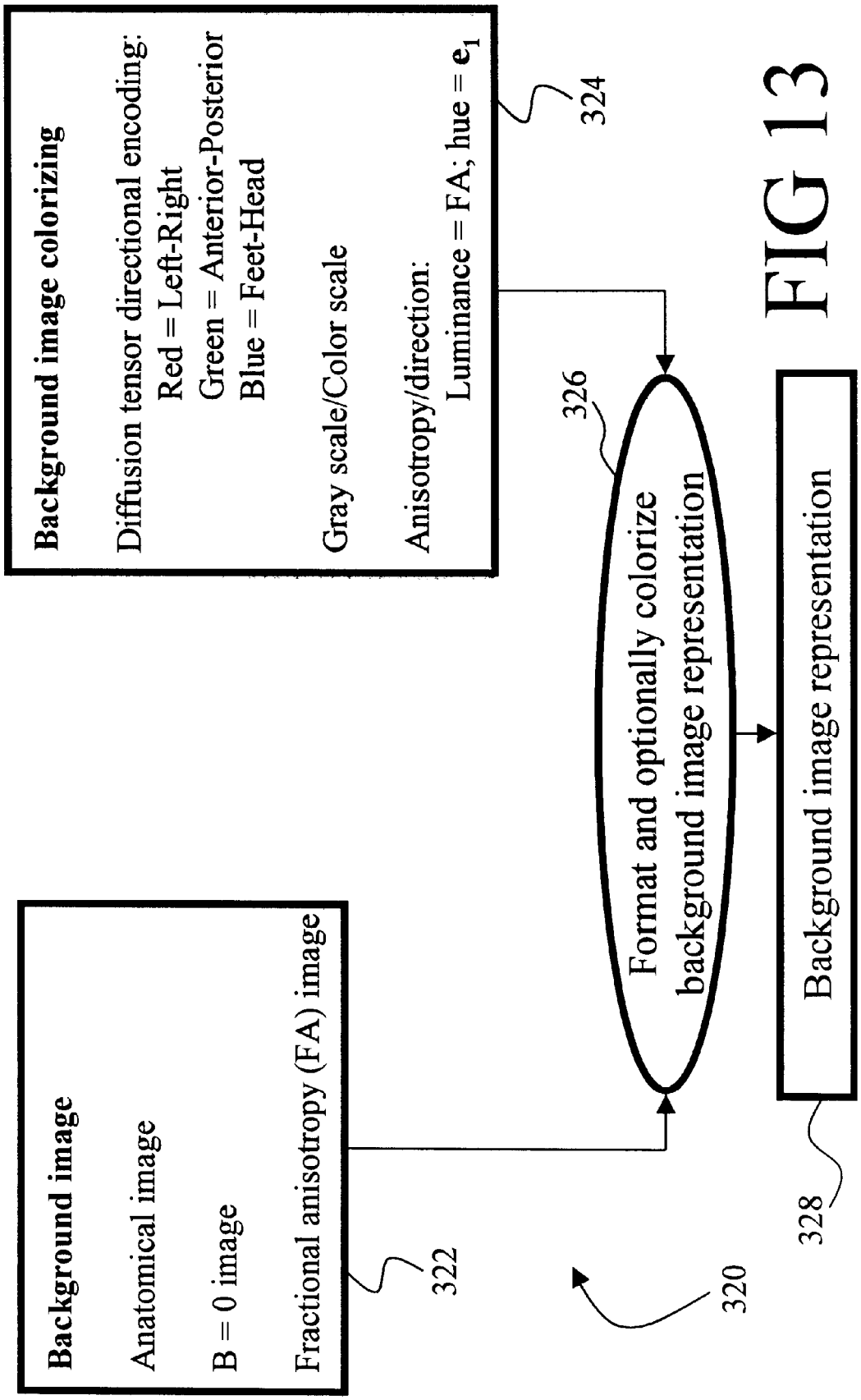
FIG. 13 shows an exemplary method for producing an image background representation.

With reference to FIG. 13, a suitable method 320 for selecting and colorizing a background image is described. The user input devices 62, 64 are preferably used to select from among a plurality of background image options 322, such as an anatomical image, the B=0 image $S_o$ 40$_o$ (see FIG. 1), the anisotropy map 50 (see FIG. 1), or another image that corresponds with the DT-MRI imaging and the tracked 3-D fibers 208. One of a plurality of background image colorizing options 324 is also preferably selected. Once background image type and colorizing options 322, 324 are selected, the background image is formatted and optionally colorized in a step 326 to generate a background image representation 328.

One suitable background image colorizing option employs a conventional gray scale. Gray scale colorizing is particularly suitable for anatomical MRI background images because it is a familiar format for displaying such images. Gray scale colorizing also advantageously provides a relatively uniform and color-neutral background on which a bright yellow or otherwise colored fiber hyperstreamline representation appears distinctly. Gray scale colorizing is computationally straightforward which improves processing speed when the fiber hyperstreamline representation 238 and the background image 328 are rotated in 3-D. Instead of a gray scale, a color intensity representation such as a color-LUT image intensity encoding is also contemplated.

In another suitable background image colorizing option, directional color encoding is used. The voxels are colored based on the diffusion tensor direction. In one suitable encoding scheme, voxels with the major eigenvector $e_1$ running generally left-right are colored red, voxels with the major eigenvector $e_1$ running generally in the anterior-posterior are colored green, and voxels with the major eigenvector $e_1$ running generally in the feet-head direction are colored blue. Of course, other color encoding schemes can be used. However, preferably a directional color encoding scheme is selected and uniformly applied, so that in rotatable 3-D hyperstreamline renderings 238 and background images 328 the color encoding provides a reliable reference to the anatomical orientation regardless of the rotation. In particular, the colors selected for the background image directional color encoding option preferably match, the colors selected for the hyperstreamline representation fiber directional color encoding and anisotropy/direction colorizing options, so that the user becomes familiar with a single uniformly applied directional colorizing scheme and can immediately associate, for example, red with fibers running in the left-right anatomical direction regardless of the rotation orientation.

In yet another suitable colorizing option, a combined anisotropy/direction encoding scheme is employed. In this scheme, the color or hue is selected based on the major eigenvector direction $e_1$ (see FIG. 2). In the combined anisotropy/direction encoding option, the intensity or luminance of each background image voxel encodes the fractional anisotropy or other diffusion tensor-related parameter. In this way, the user receives both an anatomical direction reference through the colorizing hue and an indication of the fractional anisotropy or other diffusion tensor-related parameter through the luminance.

It will be appreciated that the directional and combined anisotropy/direction color encoding schemes for the image background 328 and for the fiber hyperstreamline representation 238 are substantially similar and preferably use a single, uniform directional encoding colorizing scheme. In one preferred embodiment, the single colorizing processor 74 shown in FIG. 1 is employed for colorizing both the hyperstreamline 238 and the image background 328.

Different and complementary colorizing options are preferably employed for the hyperstreamline 238 and the image background 328 in any particular image, so that there is a reasonable contrast between the hyperstreamline 238 and the image background 328. Particularly useful hyperstreamline/ background image colorizing combinations include a color encoded hyperstreamline (directional or anisotropy/direction) on a gray scale image background, and a bright yellow hyperstreamline on a color encoded image background (diffusion tensor directional or anisotropy/direction).

Figure 14:
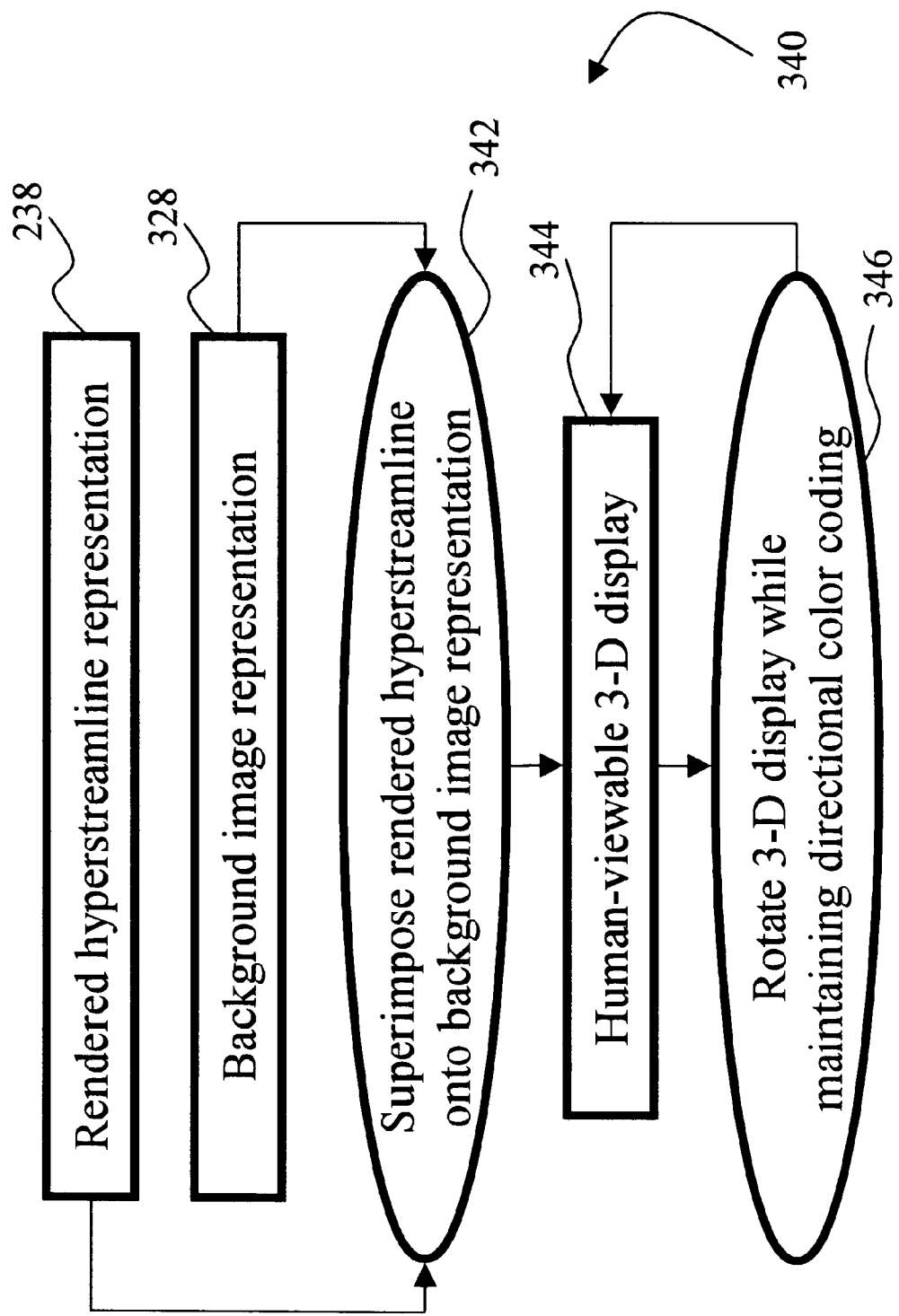
FIG. 14 shows an exemplary method for producing a human-viewable interactive display of a tracked fiber hyperstreamline representation.

With continuing reference to FIGS. 6 and 13, and with further reference to FIG. 14, a suitable method 340 for producing an interactive human-viewable fiber tracking results display is described. In a step 342, the rendered hyperstreamline representation 238 is superimposed onto the background image representation 328, e.g. by replacing voxels of the background image representation 328 with corresponding voxels of the rendered hyperstreamline representation 238 in the regions of the hyperstreamline. The superimposing 342 produces a human-viewable display 344.

Preferably, the display 344 includes an interactive fibrous structure model. For example, responsive to user inputs such as a motion or selection using the pointing device 64, the display 344 is advantageously rotated in a step 346 to produce an updated rotated display 344. Optionally, one of the rendered hyperstreamline representation 238 and the image background representation 328 includes directional color encoding to provide a color-coordinated reference to the anatomical orientation during the rotation. Optionally, the background image representation 328 includes anisotropy/direction color encoding which can suggest fibers other than the tracked fiber, albeit without tracking information. This allows the user to relate the hyperstreamline rendering 238 with other apparent fibrous structures including potentially linking fibers, which the user can subsequently track or otherwise examine. Preferably, the user has the option of changing the colorizing options for the hyperstreamline representation 238 and/or the image background 328 in accordance with the methods 220, 320 during the viewing 340.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. An imaging method for imaging a subject including anisotropic structures, the method comprising:

acquiring a three-dimensional apparent diffusion tensor map of at least a portion of the subject including at least some anisotropic structures;

processing the apparent diffusion tensor map at a voxel to obtain eigenvectors and eigenvalues;

tracking a three-dimensional fiber representation using the eigenvectors and eigenvalues;

rendering the three-dimensional fiber representation as a hyperstreamline representation having a direction corresponding to a direction of the three-dimensional fiber representation and a cross-section indicative of diffusion anisotropy;

generating a background image representation of the portion of the subject corresponding to the three-dimensional apparent diffusion tensor map; and producing a human-viewable display including the hyperstreamline representation superimposed on the background image representation.

2. The imaging method as set forth in claim 1, wherein the tracking of a three-dimensional fiber representation includes:

receiving a selection of a starting region in the diffusion tensor map;

selecting a voxel in he starting region;

determining a local direction based on the eigenvectors and eigenvalues of the selected voxel;

identifying a next voxel along the local direction; and repeating the determining of a local direction and the identifying of a next voxel a plurality of times to extract the three-dimensional fiber representation.

3. The imaging method as set forth in claim 2, wherein the tracking of a three-dimensional fiber representation further includes terminating the repeating responsive to one of:

an anisotropy parameter of the next voxel being less than a selected threshold, a change in the local direction at the next voxel being greater than a selected angle, and an entrance of the next voxel into a selected ending region of interest.

4. The imaging method as set forth in claim 2, wherein the receiving of a selection of a starting region includes:

showing a human-viewable selection display of an image representation of the subject; and showing on the selection display a graphical selection tool operable by an associated user for selecting the starting region.

5. The imaging method as set forth in claim 1, wherein the rendering of the three-dimensional fiber representation as a hyperstreamline representation includes rendering one of:

a circular tubular hyperstreamline representation, an ellipsoidal tubular hyperstreamline representation, a helix hyperstreamline representation, and a double helix hyperstreamline representation.

6. The imaging method as set forth in claim 1, wherein the rendering of the three-dimensional fiber representation as a hyperstreamline representation includes:

computing an anisotropy parameter for voxels along the hyperstreamline representation direction based on the eigenvectors and eigenvalues of the voxels; and rendering the hyperstreamline representation as a circular tube having a diameter proportional to the anisotropy parameter of corresponding voxels.

7. The imaging method as set forth in claim 1, wherein the rendering of the three-dimensional fiber representation as a hyperstreamline representation includes:

rendering the hyperstreamline representation as an ollipsoidal tube having major and minor axis dimensions encoding medium and minor eigenvalues respectively, and having major and minor axis orientations corresponding to medium and minor eigenvector directions respectively.

8. The imaging method as set forth in claim 1, wherein the rendering of the three-dimensional fiber representation as a hyperstreamline representation includes:

rendering the hyperstreamline representation as a ribbon having a width encoding an anisotropy parameter and having an orientation selected based on an orientation of the eigenvectors.

9. The imaging method as set forth in claim 1, wherein the rendering of the three-dimensional fiber representation as a hyperstreamline representation includes:

rendering the hyperstreamline representation as a double ribbon, a first ribbon having a width encoding a medium eigenvalue and an orientation corresponding with a direction of a medium eigenvector, a second ribbon having a width encoding a minor eigenvalue and an orientation corresponding with a direction of a minor eigenvector.

10. The imaging method as set forth in claim 1, wherein the rendering of the three-dimensional fiber representation as a hyperstreamline representation includes:

rendering the hyperstreamline representation in a uniform color with high contrast respective to the background image representation.

11. The imaging method as set forth in claim 10, wherein the rendering of the three-dimensional fiber representation as a hyperstreamline representation in a uniform color includes:

shading the hyperstreamline representation to visually enhance its three-dimensional orientation.

12. The imaging method as set forth in claim 1, wherein the rendering of the three-dimensional fiber representation as a hyperstreamline representation includes:

rendering the hyperstreamline representation with voxels each including at least one color characteristic that encodes one of:

a selected parameter associated with the eigenvalues and eigenvectors of the voxel, and a direction of a hyperstreamline portion containing the voxel.

13. The imaging method as set forth in claim 1, wherein the rendering of the three-dimensional fiber representation as a hyperstreamline representation includes:

rendering the hyperstreamline representation with a luminescence proportional to an anisotropy parameter computed from the eigenvalues and eigenvectors.

14. The imaging method as set forth in claim 1, wherein the rendering of the three-dimensional fiber representation as a hyperstreamline representation includes:

rendering the hyperstreamline representation with a hue of each voxel of the hyperstreamline representation encoding a direction of a major eigenvector.

15. The imaging method as set forth in claim 1, wherein the generating of an image background representation includes:

generating a gray scale representation of an image corresponding to the apparent diffusion tensor map that does not include diffusion weighting.

16. The imaging method as set forth in claim 1, wherein the generating of an image background representation includes:

displaying the image background representation with voxels each including at least one color characteristic that encodes a selected parameter computed from the eigenvectors and eigenvalues of the voxel.

17. The imaging method as set forth in claim 1, wherein the generating of an image background representation includes:

displaying each voxel with a luminescence proportional to an anisotropy parameter computed from the eigenvectors and eigenvalues of the voxel.

18. The imaging method as set forth in claim 1, wherein the generating of an image background representation includes:

displaying each voxel with a hue encoding a direction of a major eigenvector of the voxel.

19. The imaging method as set forth in claim 1, wherein he producing of a human-viewable display includes:

producing an interactive three-dimensional model that is rotatable responsive to selected user inputs.

20. The imaging method as set forth in claim 1, wherein the producing of a human-viewable display includes:

color-encoding one of the hyperstreamline representation and the generated background image representation based on anatomical orientation; and rotating the display responsive to an input, the color encoding continuing to correspond to anatomical orientation during the rotating.

21. An apparatus for tracking fibrous structures in a subject, the apparatus comprising:

a magnetic resonance imaging scanner configured to acquire diffusion-weighted imaging data;

a reconstruction processor which reconstructs the acquired diffusion-weighted imaging data into diffusion-weighted image representations;

a diffusion tensor mapping processor that constructs a diffusion tensor map by selectively combining selected diffusion-weighted image representations;

an eigenvalues/eigenvectors processor that obtains eigenvalues and eigenvectors of voxels of the diffusion tensor map;

a fibrous structure tracking processor that computes a fibrous structure representation based on the eigenvalues and eigenvectors and at least one starting voxel selection;

a rendering processor that computes a hyperstreamline representation of the fibrous structure representation, the hyperstreamline representation having a direction aligned with a largest eigenvector and a cross-sectional dimension based on the eigenvalues; and a display device that displays the hyperstreamline representation in a human-viewable medium.

22. The apparatus as set forth in claim 21, wherein the fibrous structure tracking processor includes:

a local direction processor that identifies a local fiber direction corresponding to an eigenvector direction associated with the largest eigenvalue of the selected voxel;

a next voxel processor that identifies a voxel near to the selected voxel along the local fiber direction; and a looping processor that repetitively invokes the local direction processor and the next voxel processor to iteratively compute the fibrous structure representation.

23. The apparatus as set forth in claim 21, further including:

a background image processor that computes a background image representation, the display device displaying the hyperstreamline representation superimposed on the background image representation.

24. The apparatus as set forth in claim 23, wherein the background image representation is selected from a group consisting of:

a reconstructed magnetic resonance image, and a map of an anisotropy parameter.

25. The apparatus as set forth in claim 23, further including:

a colorizing processor that colorizes at least one of the hyperstreamline representation and the background image representation, the colorizing employing at least one of luminance and hue to encode a parameter computed from the eigenvectors and eigenvalues.

26. The apparatus as set fort in claim 23, further including:

a colorizing processor that colorizes at least one of the hyperstreamline representation and the background image representation based on an orientation of a major eigenvector of the eigenvectors, the colorizing employing:

a first color for a voxel with a substantially left-right oriented major eigenvector, a second color for a voxel with a substantially feet-head oriented major eigenvector, and a third color for a voxel with a substantially anterior-posterior oriented major eigenvector.

27. The apparatus as set forth in claim 23, further including:

a data conversion processor that performs selected image processing on the diffusion weighted image representations to correct for image artifacts introduced during the image acquisition.

28. An imaging method for imaging a subject including fibrous structures, the method comprising:

acquiring diffusion tensor magnetic resonance imaging data of the fibrous structures;

processing the diffusion tensor magnetic resonance imaging data to extract a three-dimensional fiber representation of the fibrous structures; and rendering the three-dimensional fiber representation as one of:

a tube with a circular cross-section having a diameter dimension, a tube with an elliptical cross-section having major and minor axis dimensions and an orientation dimension, a ribbon having width and orientation dimensions, and a double ribbon including a first ribbon having first width and orientation dimensions and a second ribbon having second width and orientation dimensions, the tube or ribbon following a three-dimensional path of the fiber representation, and said dimensions being indicative of diffusion parameters.

29. The imaging method as set forth in claim 28, wherein the diffusion parameters are selected from a group consisting of:

a fractional anisotropy, an eigenvector direction, a function of one or more eigenvalues, and an eigenvalue.

30. The imaging method as set forth in claim 28, wherein the rendering step includes:

colorizing the tube or ribbon based on a selected diffusion parameter such that one of a hue and a luminance varies spatially with the selected diffusion parameter.

* * * * *